United States Patent [19]
Tempel

[11] Patent Number: 5,970,338
[45] Date of Patent: Oct. 19, 1999

[54] METHOD OF PRODUCING AN EEPROM SEMICONDUCTOR STRUCTURE

[75] Inventor: Georg Tempel, München, Germany

[73] Assignee: Siemens Aktiengesellschaft, Munich, Germany

[21] Appl. No.: 09/033,139

[22] Filed: Mar. 2, 1998

Related U.S. Application Data

[63] Continuation of application No. PCT/DE96/01505, Aug. 13, 1996.

[30] Foreign Application Priority Data

Aug. 28, 1995 [DE] Germany ............................ 195 31 629

[51] Int. Cl.[6] ................................................ H01L 21/8242
[52] U.S. Cl. .......................... 438/241; 438/152; 438/238; 438/384; 438/393; 438/258
[58] Field of Search ..................................... 438/241, 238, 438/239, 250, 251, 258, 152, 153, 384, 393; 148/DIG. 136

[56] References Cited

U.S. PATENT DOCUMENTS

| | | | |
|---|---|---|---|
| 4,212,684 | 7/1980 | Brower | 438/238 |
| 4,682,402 | 7/1987 | Yamaguchi | 438/384 |
| 5,338,956 | 8/1994 | Nakamura | 257/67 |
| 5,457,062 | 10/1995 | Keller et al. | 438/384 |
| 5,489,547 | 2/1996 | Erdeljac et al. | 438/238 |
| 5,500,387 | 3/1996 | Tung et al. | 438/238 |
| 5,701,025 | 12/1997 | Yoshimori | 257/379 |

FOREIGN PATENT DOCUMENTS

| | | |
|---|---|---|
| 0152625A2 | 8/1985 | European Pat. Off. . |
| 0435534A2 | 7/1991 | European Pat. Off. . |
| 62-71099 | 4/1987 | Japan . |
| 2-27762 | 1/1990 | Japan . |
| 2-177471 | 7/1990 | Japan . |
| 6-334555 | 12/1994 | Japan . |

OTHER PUBLICATIONS

"A Simple EEPROM Cell Using Twin Polysilicon Thin Film Transistors", Cao et al., IEEE Electron Device Letters, vol. 15, No. 8, Aug. 1994.

*Primary Examiner*—Michael Trinh
*Attorney, Agent, or Firm*—Herbert L. Lerner; Laurence A. Greenberg

[57] ABSTRACT

An EEPROM semiconductor structure is produced with a resistor, a thin-film transistor, a capacitor, and a transistor. The individual implantation steps are utilized to create various structures and, as a result, the production process is substantially simplified.

4 Claims, 2 Drawing Sheets

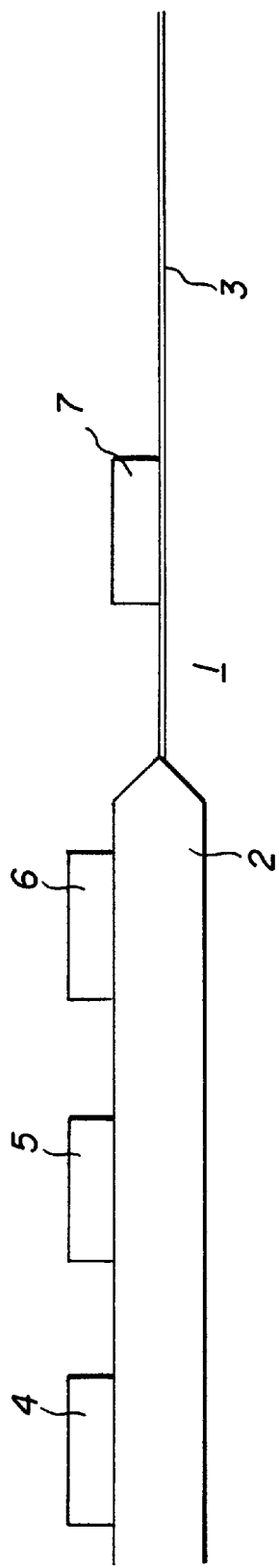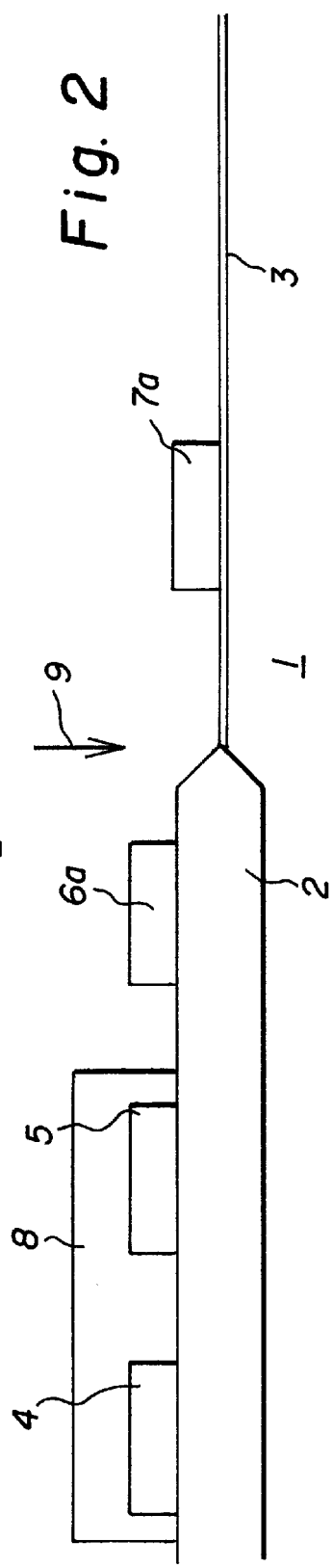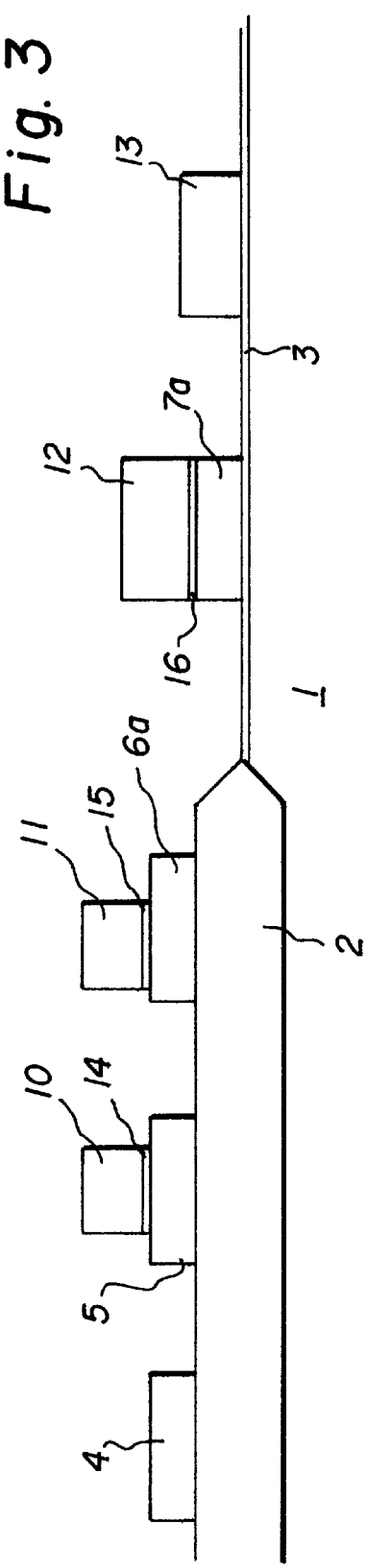

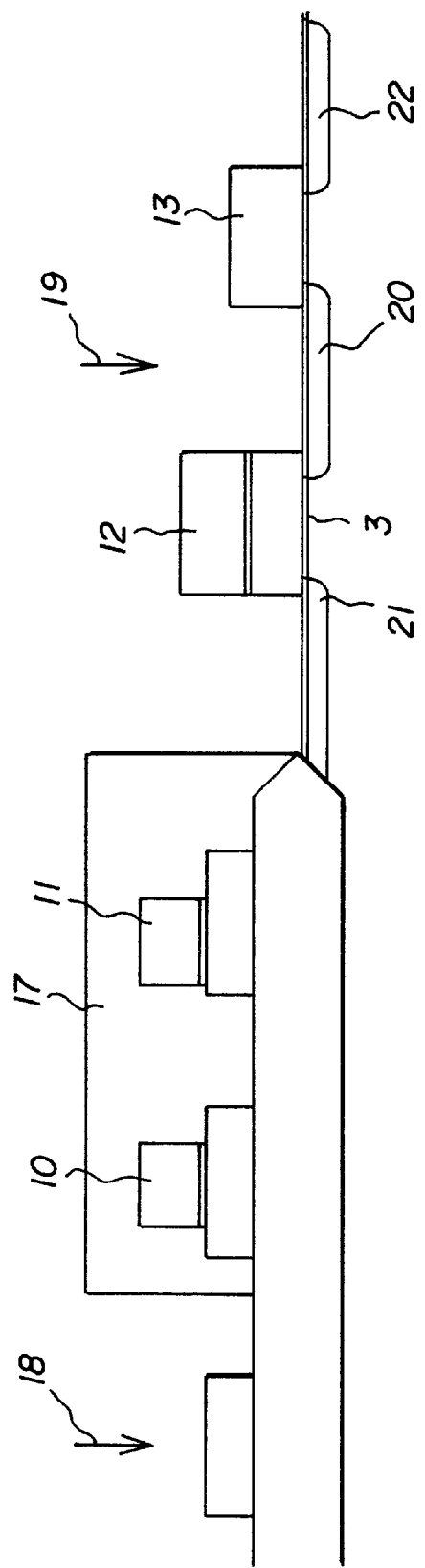
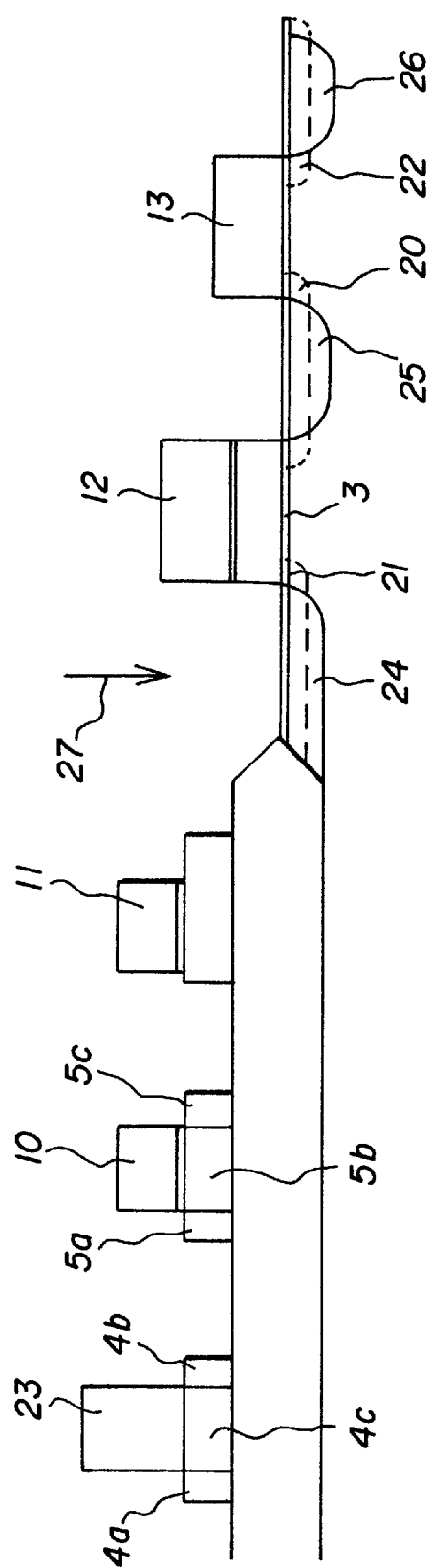

METHOD OF PRODUCING AN EEPROM SEMICONDUCTOR STRUCTURE

CROSS-REFERENCE TO RELATED APPLICATION

This application is a continuation of copending international application PCT/DE96/01505, filed Aug. 13, 1996, which designated the United States.

BACKGROUND OF THE INVENTION

FIELD OF THE INVENTION

The invention relates to semiconductor technology. More particularly, the invention pertains to a method for producing an EEPROM semiconductor structure with a resistor, a thin-film transistor, a capacitor, and a transistor.

It is a typical problem, in such semiconductor structures, that when a CMOS circuit is used, negative voltages have to be added onto a chip with a p-substrate, in which case the substrate must be kept at a zero potential. The same problem conversely arises with positive voltages, which have to be added onto an n-substrate.

In some applications, this problem can be solved by introducing a substrate bias. If a p-substrate is used, the substrate potential is shifted in the negative direction, and as a result the drain diodes of the NMOS in a CMOS inverter are merely biased positively compared to the substrate and are therefore operated in the blocking direction. A disadvantage here is the higher burden on the gate oxide from the additive negative substrate bias. The electrical properties, such as the NMOS on-state voltage and hence the drain current and performance, are dependent on the substrate voltage. Furthermore, the negative voltage must be generated on the chip.

If a negative polarization of the substrate cannot be allowed, then the NMOS transistors that connect the negative voltage can be placed in an isolated p-well. The isolation is achieved by means of a deeper n-well, which completely surrounds the p-well and which is blocked to the substrate at the same negative well bias. If an n-substrate is used, the opposite conductivity type must be used. However, producing such an additional, isolating well makes the overall process more complicated and expensive, and high-energy implantation is necessary.

In many processes in which the above-described problem arises, an additional polyplane and an interpolydielectric are generally processed along with the transistor polyplane. Examples of this are analog and memory processes.

SUMMARY OF THE INVENTION

It is accordingly an object of the invention to provide a method of producing an EEPROM semiconductor structure, which overcomes the above-mentioned disadvantages of the prior art devices and methods of this general type and with which negative voltages can be added on a p-substrate, or positive voltages on an n-substrate, and which is especially simple and requires only a few process steps.

With the foregoing and other objects in view there is provided, in accordance with the invention, a method of producing an EEPROM semiconductor structure with a resistor, a thin-film transistor, a capacitor, a memory transistor, and a transistor, the method which comprises:

providing a semiconductor substrate of a first conductivity type, and forming a field oxide in a first partial region of the substrate and a gate oxide in a second partial region of the substrate;

depositing a first polysilicon layer on the substrate and subsequently structuring the first polysilicon layer to form silicon structures for a resistor, for a thin-film transistor, and for a capacitor on the field oxide, and a silicon structure for a memory transistor on the gate oxide;

masking the silicon structures for the resistor and the thin-film transistor with a mask and doping the silicon structures for the capacitor and the memory transistor with a dopant of a second conductivity type;

removing the mask, and depositing and structuring an interpolydielectric on the silicon structures of the thin-film transistor, the capacitor, and the memory transistor, and depositing polysilicon on the interpoly-dielectric and structuring the polysilicon to form a second silicon structure for the transistor;

masking the regions for the thin-film transistor and the capacitor with a further mask, and, in a second implantation step, performing an LDD implantation in the region of the memory transistor and the transistor, and simultaneously doping the silicon structure for the resistor;

removing the further mask; subsequently masking a center region of the resistor; and, in a third implantation step, performing a source-drain implantation with a dopant of the second conductivity type, and simultaneously doping outer regions of the silicon structures for the resistor and the thin-film transistor.

In accordance with the fundamental concept of the invention, a semiconductor substrate is defined with first and second partial regions, a field oxide layer is created in the first partial region, and a gate oxide is created in the second partial region. By the deposition of a first polysilicon layer and ensuing structuring, silicon regions are created on the field oxide for the resistor, the thin-film transistor, memory or floating gates of the EEPROM cell, and the capacitor. At the same time, a silicon structure for the memory transistor is created on the gate oxide. The silicon regions for the resistor and the thin-film transistor are covered using a mask technique, and the silicon structures for the capacitor and the transistor are doped with atoms or ions of one conductivity type. Next, the mask is removed, and in the region of the silicon structures of the thin-film transistor, the capacitor and the transistor, an interpolydielectric is processed. In a further step a second polysilicon layer is deposited, simultaneously creating a second silicon structure for the transistor. After that, the thin-film transistor and the capacitor are covered with a mask, and LDD implantations are carried out in a second implantation in the region of the transistor. The resistor is doped at the same time. The mask used in the process is removed, and a new mask is created in the middle region of the resistor, and by using this mask, a third implantation for the source-drain implantation is carried out, using dopant atoms or ions of the same conductivity type; at the same time, the outer regions of the silicon structures in the region of the resistor and of the thin-film transistor are doped. In this way, an analog resistor, a thin-film transistor, a capacitor and a transistor are obtained by the overall process according to the invention for producing the EEPROM cell.

In accordance with an added feature of the invention, the semiconductor substrate is an n-type substrate, and the implantations are performed with atoms of the p conductivity type. In other words, if an n-substrate is used, the implantated dopant atoms or ions are of the p conductivity type. If a p-substrate is used, conversely, ions or atoms of the n conductivity type must be used in the implantations, and the opposite types of transistors and wells are obtained.

In accordance with an additional feature of the invention, the second implantation step comprises adapting a thickness of the interpolydielectric and a thickness of the first polysilicon layer to an LDD implantation dose. This feature represents another advantage of the invention, namely that the thin-film transistor can essentially be integrated into a conventional analog CMOS process without additional masking effort or expense. This is possible by adapting the thicknesses of the interpolydielectric and the first polysilicon layer and the dose of the LDD implantation to one another.

In accordance with a concomitant feature of the invention, the transistor formed in the described process is a thin-film transistor. The thin-film transistor created in the overall process of the invention is isolated from the substrate by a thick oxide and it acts together with the transistor as a modified CMOS inverter. By means of this inverter, created in accordance with the invention, the possibility also exists of applying negative voltages to a chip with a p-substrate. If an n-substrate is used, conversely, it becomes possibile to connect positive voltages. In this way, it is easy to furnish a circuit for negative levels that can be produced without major effort or expense, for instance by creating the deeper, oppositely doped wells described at the outset (triple-well process).

In a refinement of the invention, a symmetrical TFT inverter can also be created. Then the conventional transistor described here would also be made in the form of an additional thin-film transistor.

Other features which are considered as characteristic for the invention are set forth in the appended claims.

Although the invention is illustrated and described herein as embodied in a method for producing a EEPROM semiconductor structure, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing figures.

BRIEF DESCRIPTION OF THE DRAWING

FIGS. 1–5 are schematic elevational views showing the formation of the entire EEPROM cell, in various stages of the novel process.

DESCRIPTION OF THE PREFERRED EMBODIMENTS

Referring now to the figures of the drawing in detail and first, particularly, to FIG. 1 thereof, there is seen an n-conductive silicon substrate 1. A thick oxide, in this case a field oxide 2, is grown or oxidized onto a partial region, and a gate oxide 3 is created in a partial region bordering it. This structuring is done by the LOCOS process. A first polysilicon layer is deposited thereon and subsequently structured. This results in polysilicon structures 4, 5 and 6 on the field oxide 2, from which structures an analog resistor, a thin-film transistor, and a capacitor are formed. A structure 7 is formed on the gate oxide 3 that is used to form a transistor. In a defined oven step, this polysilicon plane is converted into a good crystalline structure. The structures 4, 5, 6 and 7 are all made from the same polysilicon layer.

The next steps in the process are now described with reference to FIG. 2. A photoresist mask 8 is created over the silicon structures 4 and 5 which serves as a mask in an ensuing implantation. An arrow 9 indicates an $n^+$ implantation, with which the silicon structures 6 and 7 are converted into $n^+$-doped structures 6a and 7a. This photo technique for creating the doped silicon structure 6a, which acts as a lower capacitor plate, is essentially the only step, compared with a standard process, that has to be added to in order to obtain the complete EEPROM cell with an integrated TFT (thin-film transistor).

Referring now to FIG. 3, the photoresist mask 8 is subsequently removed, and at least in the region of the silicon structures 5, 6a and 7a an interpolydielectric 14, 15 and 16, which comprises an oxide, is processed. An oxide that in this process might be processed in the region of the structure 4 is no hindrance to the rest of the overall process. Over it, a second polysilicon layer is deposited and structured. This layer forms the actual transistor polyplane and is deposited in the region of the thin-film transistor, that is, on the polysiliconstructure 5, in a middle region, thus creating a polysilicon structure 10 that is spaced apart on both sides from the edges of the structure 5. In the region of the capacitor, the second polysilicon layer is converted into a structure 11 that on at least one side leaves part of the underlying structure 6a free, so that a connection face is created there. The upper region of the structure 11 forms the second connection face of the capacitor, whose two faces are separated from one another by the interpolydielectric 15. In the region of the transistor, structures 12 and 13 are formed from the second polysilicon layer; of these, the structure 12 agrees in size with the $n^+$-doped structure 7a lying under it.

Next, reference is had to FIG. 4: In the region of the thin-film transistor and the capacitor, that is, above the structures 10 and 11 of the second polysilicon plane, a photoresist mask 17 is produced, which protects this region from the ensuing LDD implantation with ions or atoms of the n conductivity type. The implantation is indicated by arrows 18 and 19. At the same time, the silicon structure 4 of the resistor is doped negatively, and between the structures of the transistor 7a and 13, shallow, relatively weakly negatively doped LDD regions 20, 21 and 22 are created that engage the aforementioned structures from below.

The concluding process steps are shown in FIG. 5. The photoresist mask 17 of FIG. 4 is first removed, and a new photoresist mask 23 is formed in the middle region of the silicon structure 4 of the resistor.

Both the photoresist mask 17 and the photoresist mask used for the source-drain implantation are used in standard fashion in a CMOS process. Several photo techniques are also known for a $p^+$ implantation within the n-well. The $p^+$-$I^2$ photo technique is not shown, for the sake of clarity in the drawing. In that case, the elements shown here would be covered with photoresist.

After that, a source-drain implantation, represented by the arrow 27, is performed with charge carriers or atoms of the n conductivity type. At the same time, $n^+$-doped regions 4a and 4b are created in the resistor, so that in the final analysis a resistor is created that has the two $n^+$-doped regions 4a and 4b on the outsides and the n-doped region 4c between them. In the thin-film transistor, the same implantation creates $n^+$-doped regions 5a and 5c on the outsides, which surround the undoped region 5b lying under the structure 10 of the second polysilicon layer of the thin-film transistor. In addition, in the source-drain implantation in the region of the transistor, the $n^+$-doped wells 24, 25 and 26 are created, which in general are deeper than the diffusion zones 20, 21 and 22 created beforehand in the LDD implantation.

Another way of describing this is as a simultaneous self-adjusted implantation of the source-to-drain contacts of the thin-film transistor and of the conventional transistor. With one and the same implantation, the terminals for the resistor, the drains of the thin-film transistor, and the $n^+$ drains of the NMOS transistor are thus implanted. A photo technique is needed for each of the three implantations used in this method.

I claim:

1. A method of producing an EEPROM semiconductor structure with a resistor, a thin-film transistor, a capacitor, a memory transistor, and a transistor, the method which comprises:

providing a semiconductor substrate of a first conductivity type, and forming a field oxide in a first partial region of the substrate and a gate oxide in a second partial region of the substrate;

depositing a first polysilicon layer on the substrate and subsequently structuring the first polysilicon layer to form silicon structures for a resistor, for a thin-film transistor, and for a capacitor on the field oxide, and a silicon structure for a memory transistor on the gate oxide;

masking the silicon structures for the resistor and the thin-film transistor with a mask and doping the silicon structures for the capacitor and the memory transistor with a dopant of a second conductivity type;

removing the mask, and depositing and structuring an interpolydielectric on the silicon structures of the thin-film transistor, the capacitor, and the memory transistor, and depositing polysilicon on the interpolydielectric and structuring the polysilicon to form a second silicon structure for the transistor;

masking the regions for the thin-film transistor and the capacitor with a further mask, and, in a second implantation step, performing an LDD implantation in the region of the memory transistor and the transistor, and simultaneously doping the silicon structure for the resistor;

removing the further mask; subsequently masking a center region of the resistor; and, in a third implantation step, performing a source-drain implantation with a dopant of the second conductivity type, and simultaneously doping outer regions of the silicon structures for the resistor and the thin-film transistor.

2. The method according to claim 1, wherein the semiconductor substrate is an n-type substrate, and the implantations are performed with atoms of the p conductivity type.

3. The method according to claim 1, wherein the second implantation step comprises adapting a thickness of the interpolydielectric and a thickness of the first polysilicon layer to an LDD implantation dose.

4. The method according to claim 1, wherein the steps of forming the transistor comprise forming a thin-film transistor.

* * * * *